(12) United States Patent
Huang et al.

(10) Patent No.: US 10,643,818 B2
(45) Date of Patent: *May 5, 2020

(54) LOAD LOCK SYSTEM FOR CHARGED PARTICLE BEAM IMAGING

(71) Applicant: ASML Netherlands B.V., Veldhoven (NL)

(72) Inventors: Hsuan-Bin Huang, Hsinchu (TW); Chun-Liang Lu, Hsinchu (TW); Chin-Fa Tu, Hsinchu (TW); Wen-Sheng Lin, Hsinchu (TW); Youjin Wang, Milpitas, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

This patent is subject to a terminal disclaimer.

(21) Appl. No.: 16/241,910

(22) Filed: Jan. 7, 2019

(65) Prior Publication Data

US 2019/0214225 A1    Jul. 11, 2019

Related U.S. Application Data

(63) Continuation of application No. 15/440,111, filed on Feb. 23, 2017, now Pat. No. 10,176,967.

(51) Int. Cl.
*H01J 37/26* (2006.01)
*G01B 11/00* (2006.01)
(Continued)

(52) U.S. Cl.
CPC ............ *H01J 37/261* (2013.01); *G01B 11/00* (2013.01); *H01J 37/18* (2013.01); *H01J 37/185* (2013.01);
(Continued)

(58) Field of Classification Search
CPC .......... H01J 37/18; H01J 37/185; H01J 37/20; H01J 37/261; H01J 37/28;
(Continued)

(56) References Cited

U.S. PATENT DOCUMENTS 5,073,716 A * 12/1991 Clemens ................. H01J 37/20
250/440.11
5,308,989 A    5/1994 Brubaker
(Continued)

FOREIGN PATENT DOCUMENTS

| EP | 1 047 114 A2 | 10/2000 |
|---|---|---|
| EP | 1 457 832 A1 | 9/2004 |
| EP | 1 047 114 A3 | 1/2006 |

OTHER PUBLICATIONS

International Preliminary Report on Patentability in International Application No. PCT/EP2018/054144 dated Aug. 27, 2019, 10 pages.
(Continued)

*Primary Examiner* — David E Smith
(74) *Attorney, Agent, or Firm* — Finnegan, Henderson, Farabow, Garrett & Dunner, LLP

(57) ABSTRACT

A load lock system for charged particle beam imaging with a particle shielding plate, a bottom seal plate and a plurality of sensor units is provided. The sensor units are located above the wafer, the shield plate is designed to have a few number of screws, and the bottom seal plate contains no cable, no contact sensors and fewer screws used. In the invention, the system is designed to improve the contamination particles from components in the load lock system of charged particle beam inspection tool and also to simplify its assembly.

21 Claims, 9 Drawing Sheets

(51) Int. Cl.
*H01J 37/28* (2006.01)
*H01J 37/20* (2006.01)
*H01J 37/18* (2006.01)
*H01L 21/67* (2006.01)
*H01L 21/677* (2006.01)

(52) U.S. Cl.
CPC .............. *H01J 37/20* (2013.01); *H01J 37/28* (2013.01); *H01J 2237/022* (2013.01); *H01J 2237/20292* (2013.01); *H01J 2237/28* (2013.01); *H01L 21/67201* (2013.01); *H01L 21/67265* (2013.01); *H01L 21/67766* (2013.01)

(58) Field of Classification Search
CPC ......... H01J 2237/20292; H01J 2237/28; H01J 2237/022; G01B 11/00; H01L 21/67201; H01L 21/67265; H01L 21/67766
See application file for complete search history.

(56) References Cited

U.S. PATENT DOCUMENTS

| | | |
|---|---|---|
| 5,585,629 A | 12/1996 | Doran et al. |
| 5,598,002 A | 1/1997 | Todokoro et al. |
| 5,940,175 A * | 8/1999 | Sun ................... G01N 21/9501 356/237.3 |
| 6,842,221 B1 | 1/2005 | Shiraishi |
| 7,018,504 B1 | 3/2006 | Raajmakers et al. |
| 7,960,697 B2 | 6/2011 | Chen et al. |
| 10,176,967 B2 * | 1/2019 | Huang ................. H01J 37/261 |
| 2004/0046125 A1 | 3/2004 | Chen |
| 2005/0207875 A1 | 9/2005 | Kim |
| 2007/0023684 A1* | 2/2007 | Lewis ..................... H01J 37/20 250/442.11 |
| 2008/0099674 A1* | 5/2008 | Bihr ......................... G03F 1/72 250/307 |
| 2008/0107508 A1 | 5/2008 | Chan |
| 2008/0218772 A1 | 9/2008 | Binns et al. |
| 2010/0294049 A1 | 11/2010 | Kelley et al. |
| 2012/0112068 A1 | 5/2012 | Maeda et al. |
| 2012/0119085 A1 | 5/2012 | Ishijima et al. |
| 2016/0314572 A1 | 10/2016 | Fang |

OTHER PUBLICATIONS

International Search Report in International Application No. PCT/EP2018/054144 dated Jun. 18, 2018, 5 pages.

* cited by examiner

200

LOAD LOCK SYSTEM FOR CHARGED PARTICLE BEAM IMAGING

This application is a continuation application of application Ser. No. 15/440,111, entitled "Load Lock System for Charged Particle Beam Imaging," filed Feb. 23, 2017, which is incorporated herein by reference in its entirety.

FIELD OF THE INVENTION

The present invention relates to a patterning device holding apparatus. More particularly, it relates to a patterning device holding apparatus for a charged particle beam system.

BACKGROUND OF THE INVENTION

The following description and examples are not admitted to be prior art by their mention in this Background section.

In order to enhance the yield and reliability of the semiconductor devices such as integrated circuits (ICs) and memory devices, examining the defects on the patterned wafer for the avoidance of them has been significant. The physical defects, such as foreign particles, scratch defects, residual defects, bridging defects and so on, cause the devices to fail electrically, for example, the short or open circuit. Furthermore, since deep sub-micrometer node devices are developed, new and more complicated manufacturing structures such as a dual damascene structure and a fin-shaped field effect transistor (FinFET) structure are utilized in the semiconductor devices. Therefore, new types of defects including latent defects, for instance, chemical mechanical polishing (CMP) scores, under-layer leakage, under-etch, missing, voids, voltage contrast (VC) defects, and non-virtual defects (NVDs) occur during the manufacturing phase. Besides, while the less than 20 nm manufacturing process is on line, it has been a big challenge for the observation of nano-size semiconductor devices. It is consequence that the optical inspection apparatus has been stretched to the limit of its capability at the inspection of these defects and tiny devices. Herein, the issue is effectively addressed by a charged particle beam apparatus, for example, an electron beam tool based on a scanning electron microscope (SEM), and the semiconductor manufacturing and the yield enhancement can be optimized by the apparatus.

In the fabrication of a semiconductor device using a charged particle beam inspection system, however, the contamination particles are inevitably formed and thus settle on wafers being processed therein. For examples, the inspected device in EBI usually remains residual particles arising from the components in a load lock system of e-beam inspection tool when the device is inspected for an electron beam imaging (EBI) for early defect identification. Referring to FIG. 1, a transitional bottom seal plate 100 for holding a sample, comprises a cable 101 lying in a groove 103 on the plate 100 for the signal transduction from a plurality of contact detecting units 102, which are used to detect the position of the sample, and a plurality of screws 104 to keep the plate 101 and the cable 101 from moving. These components can be the sources of the contamination particles.

Such contamination problem significantly lowers the product yield and the reliability of a semiconductor device and becomes more severe with increasing higher integration levels and with increasing a processing efficiency. Therefore, it is desirable to provide a method and system capable of improving such the problem for the examination of charged particle beam system.

The present invention provides a load lock system with a patterning device holding apparatus for the charged particle beam imaging e-beam inspection tool to improve the aforementioned shortcomings of the conventional patterning device holding apparatus and reduce the possibility of damaging the semiconductor devices.

SUMMARY OF THE INVENTION

This summary is provided to comply with 37 C.F.R. § 1.73, requiring a summary of the invention briefly indicating the nature and substance of the invention. It is submitted with the understanding that it will not be used to interpret or limit the scope or meaning of the claims.

The present invention is relates to a seal load lock apparatus for holding a sample for the charged particle beam imaging.

In one embodiment, the apparatus comprises a particle shield plate disposed above the sample for shielding from at least one undesired particle from at least one component coupled with the apparatus; and a bottom seal plate located below the device for holding the sample. The apparatus further comprises at least one position detecting unit with an emitter for projecting a light beam on the sample and a receiver for receiving the reflected signal form the sample to identify the position of the sample, wherein the position detecting unit separated from the bottom seal plate, wherein the position includes at least a vertical position of the sample. In addition, the apparatus can be coupled to a load lock system that is used to transfer the device between a vacuum chamber and an atmosphere environment, wherein the load lock system is for use in an inspection tool. The apparatus further can be installed in a SORIL SEM.

The apparatus can also comprise a top seal plate disposed above the sample to form a room to seal the sample. In addition, the particle shield plate is inside the room and above the sample. The apparatus further comprises a view port located between the position detecting units and the sample to pass the light beam and a reflected signal from the sample. The position detecting unit in the apparatus can be a laser sensor. In another embodiment, the position detecting unit can be a contact sensor when the positioned on the bottom seal plate.

Another embodiment relates to a bottom seal load lock apparatus for supporting a device, comprising a particle shield plate located above the device for shielding from at least one undesired particle at least one undesired particle from at least one component coupled with the apparatus, wherein the plate has up to a maximum of three screws to fix; a bottom seal plate disposed below the device to support the device, wherein the plate has up to a maximum of three screws to fix; and a plurality of position detecting units separated from the bottom seal plate for detecting a geometric position of the device by projecting a light beam on the device.

Another embodiment relates to an inspection apparatus involving a load lock system, comprising a charged particle beam emitter for emitting a primary charged particle beam; a condenser lens for condensing the primary charged particle beam; an objective lens for focusing the primary charged particle beam to probe a sample; a plurality of deflection electrodes for scanning said charged particle beam probe across a surface of the sample; a detector for detecting secondary charged particles generated from the sample surface; and a bottom seal load lock apparatus, which is coupled to a load lock system that is used to transfer the device between a vacuum chamber and an atmosphere environment, for supporting a device, comprising: a particle shield plate located above the device for shielding from at least one undesired particle at least one undesired particle from at least one component coupled with the apparatus, wherein the plate has up to a maximum of three screws to fix; a bottom seal plate disposed below the device to support the device, wherein the plate has up to a maximum of three screws to fix; and a plurality of position detecting units separated from the bottom seal plate for detecting a geometric position of the device by projecting a light beam on the device.

Another embodiment relates to method for improving contamination particles from components in a charged particle beam inspection tool, comprising: utilizing a holding apparatus having a seal room for sealing a sample without any position detecting unit in the room; utilizing a shielding plate disposed in the room with a maximum of three screws to fix the plate to shield at least one undesired signal; and utilizing a bottom seal plate disposed in the room for supporting the sample with a maximum of three screws for fixing the plate. In addition, the method comprises the seal room formed by a top seal plate and the bottom seal plate.

The embodiments of the systems mentioned above will be further configured as described herein. Furthermore, the embodiment of the method described above may be performed by any of the systems described herein.

BRIEF DESCRIPTION OF THE DRAWINGS

The present invention will be readily understood to those skilled in the art by the following detailed description in conjunction with the accompanying drawings, wherein the same or like reference numerals designate the same or like structural elements, and in which.

Figure 1:
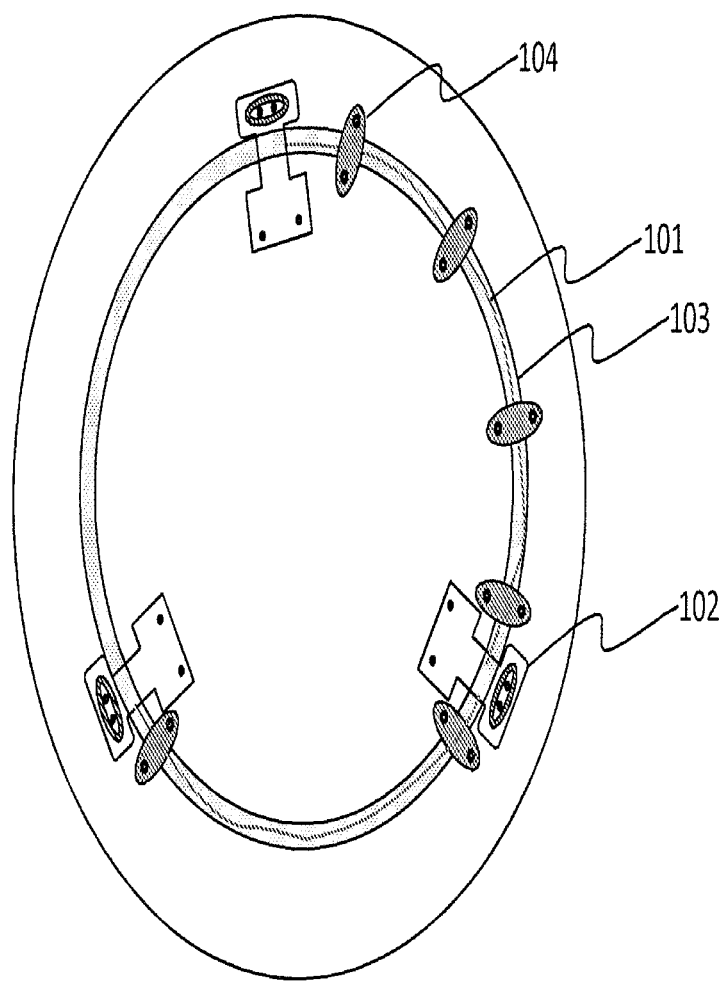
FIG. 1 is a schematic diagram illustrating a top-view of a bottom seal plate of holding apparatus in prior arts.

While the invention is susceptible to various modifications and alternative forms, specific embodiments thereof are shown by way of example in the drawings and may herein be described in detail. The drawings may not be to scale. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF THE INVENTION

The preferred embodiment herein disclosed is not intended to be exhaustive or to limit the invention to the precise form disclosed. Rather, it is chosen and described in order to best explain the invention so that others skilled in the art may utilize its teachings. Besides, in alternative embodiments, those components identical to the components of the first embodiments are given the identical reference numerals without giving another reference numerals for simplicity.

Figure 2:
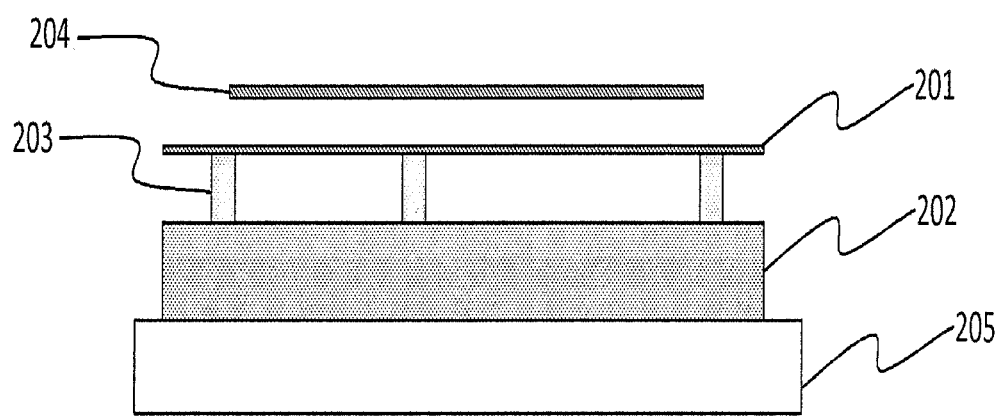
FIG. 2 is a schematic diagram illustrating a cross-section of a seal load lock apparatus for holding a sample in accordance with one embodiment of the present invention.
Figure 3:
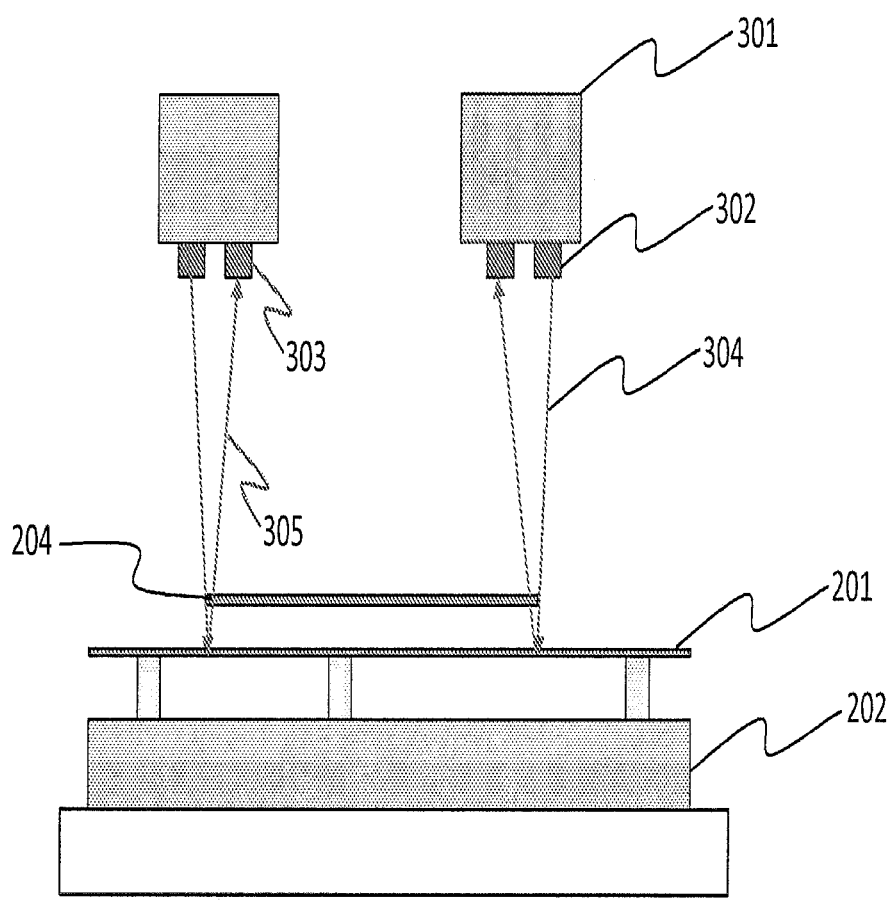
FIG. 3 is a schematic diagram illustrating a cross-section of plural non-contact position detecting units coupled with the seal load lock apparatus.

Referring now to FIG. 2, one embodiment of a seal load lock apparatus 200 for holding a wafer 201 is described below. The seal load lock apparatus 200 including a bottom plate 202 disposed on a seat 205 with plural wafer standoffs 203 to hold a wafer 201. A particle shielding plate 204 is located above the wafer 201 in the apparatus 200 to shield the undesired particles from the above components (not shown) coupled with the apparatus 200. Furthermore, a set of non-contact position detecting units 301, which is separated from the bottom plate 202, with an emitter 302 for projecting a light beam 304 to detect the wafer 201 and a receiver 303 for receiving the signals 305 from the wafer 201 are used to identify the position of the wafer 201, especially the vertical position, as shown in FIG. 3. Therein, the particle shielding plate 204 has a plurality of holes corresponding to the non-contact position detecting units 301 to allow the light beam 304 and the signals 305 passing through. The reflected signal 305 at least contains the information of the Z-axis position (i.e., the vertical position) of the wafer 201, which can be distinguished by a processing unit (not shown) via the receiver 303 to identify the position of wafer 201. Preferably, the non-contact position detecting units 301 is a laser sensor. It is contemplated that above-mentioned embodiments of the load lock apparatus described herein, along with derivations thereof, may be utilized in other processing systems and with other work piece supports.

Alternatively, rather than the non-contact position detecting units 301, a set of contact position detecting units may be disposed on the bottom plate, as shown in FIG. 1. The contact position detecting units 102 disposed on the bottom plate 100 to physically connect with the wafer 201 to identify the position of the wafer 201. Therein, a cable 101 is connected with the contact position detecting units 102 to transfer the signal form the units 102 to the processing unit (not shown).

Figure 4:
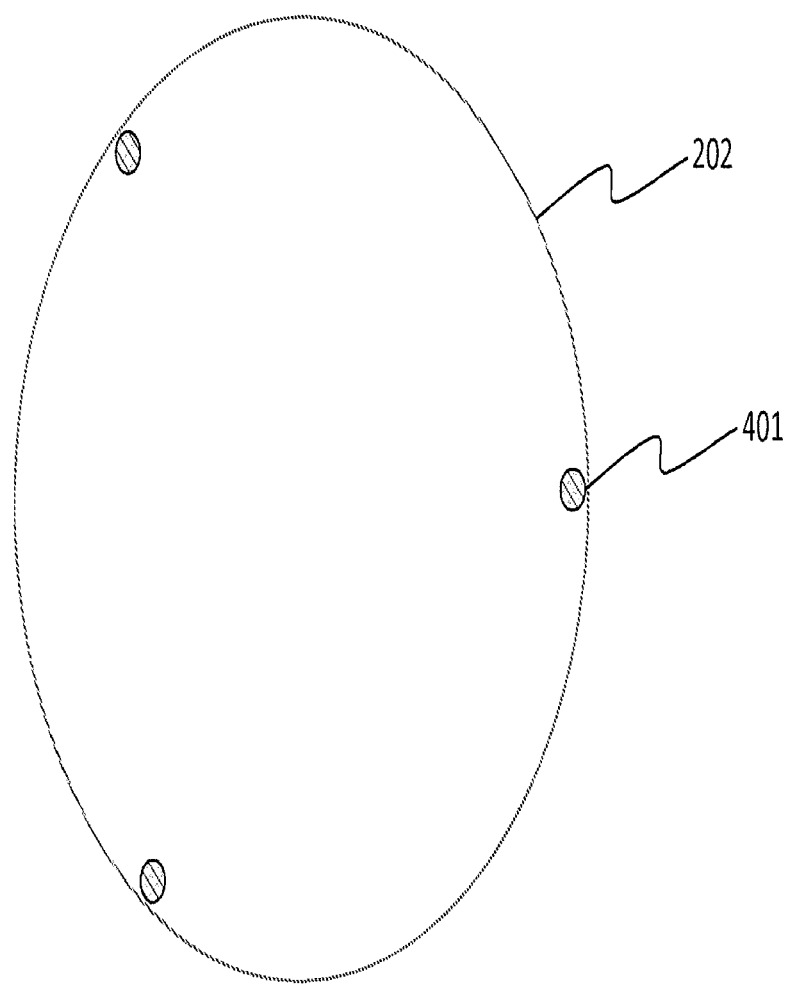
FIG. 4 is a schematic diagram illustrating a top-view of a bottom seal plate located in the seal load apparatus in accordance with one embodiment of the present invention.
Figure 5:
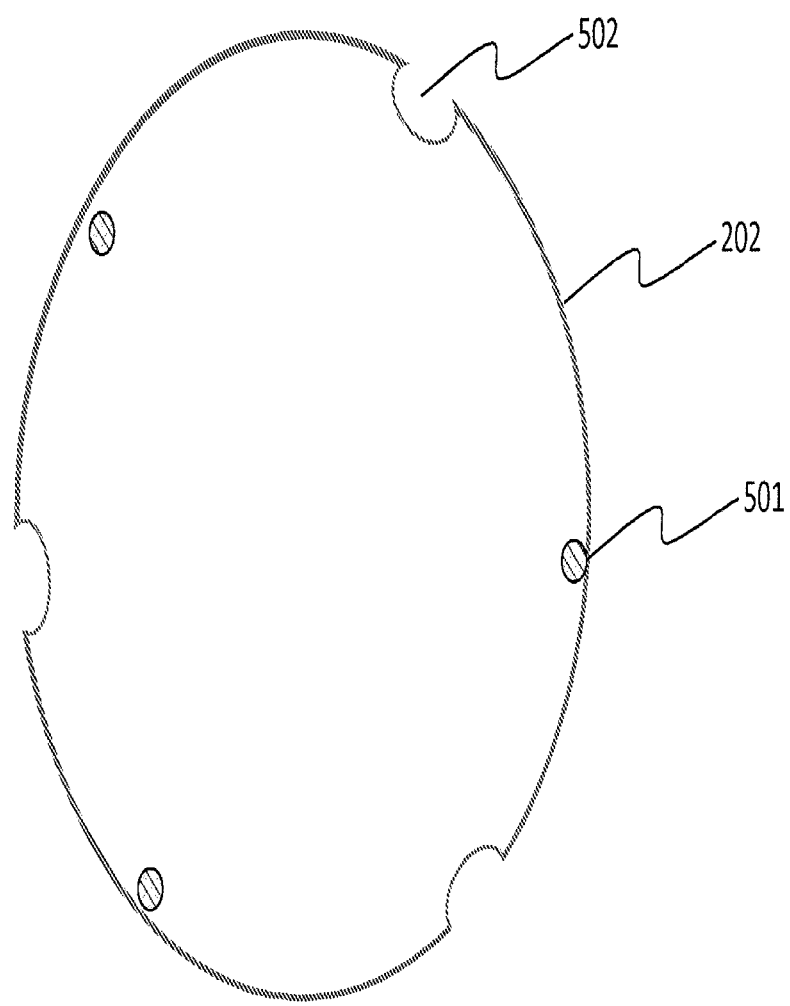
FIG. 5 is a schematic diagram illustrating a particle shielding plate located in the seal load apparatus in accordance with one embodiment of the present invention.

In the embodiment depicted in FIG. 2, in order to reduce the contamination particles from the components in the load lock apparatus 200, the bottom plate 202 and the particle shielding plate 204 can also be fixed by at the maximum of three screws 401 and 501 to the apparatus 200, respectively, as shown in FIGS. 4 and 5. Referring to FIG. 5, a set of holes 502 located on the edge of the particle shielding plate 204 corresponding to the non-contact position detecting units 301 is provided to pass through the light beam 304 and the signals 305.

Figure 6:
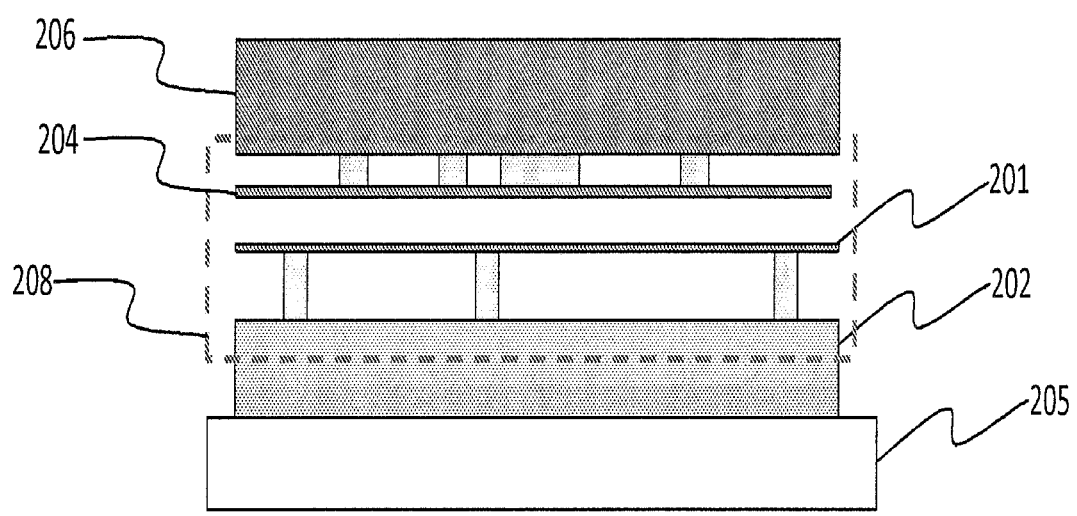
FIG. 6 is a schematic diagram illustrating a cross-section of a seal load lock apparatus with a top seal plate in accordance with one embodiment of the present invention.
Figure 7:
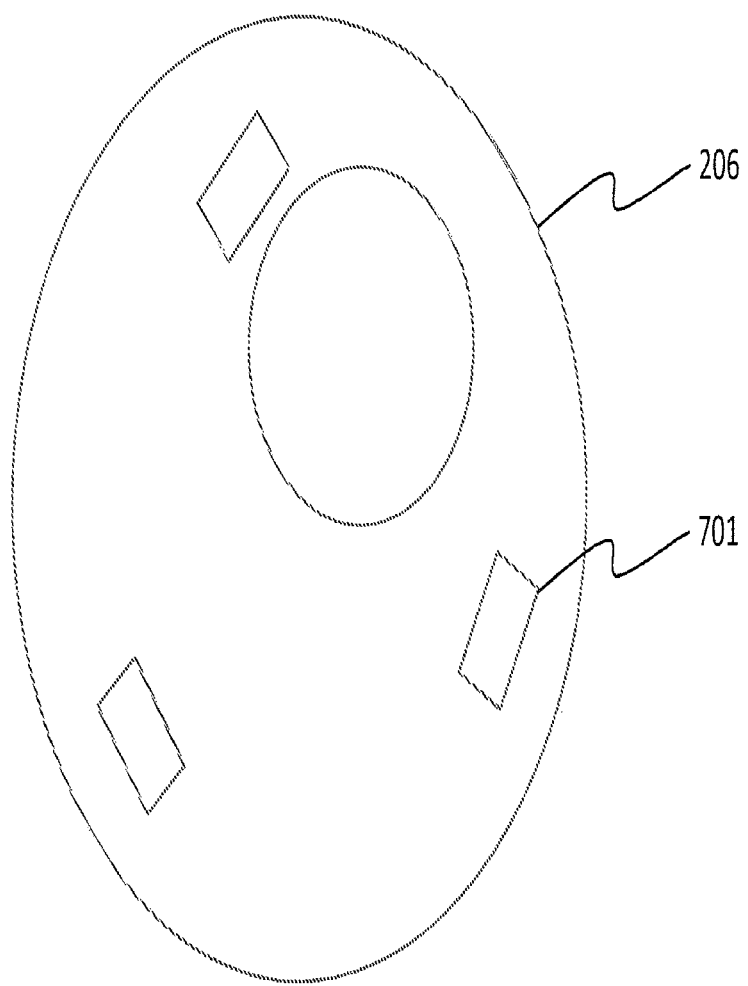
FIG. 7 shows a schematic diagram illustrating a top-view of a top seal plate located in the seal load apparatus in accordance with one embodiment of the present invention.

FIG. 6 depicts another embodiment of a load lock apparatus arrangement. The arrangement is substantially similar to the apparatus of FIG. 2 described above, except a top seal plate 206 is located in the top side of the particle shielding plate 204, which forms a seal room 208 (enclosed by the dash line) with the bottom seal plate 202. Furthermore, the particle shielding plate 204 and the wafer 201 are enclosed in the room 208, the non-contact position detecting units 301 is outside the room 208 for removing one of the possible sources of the contamination particles in the room 208. Referring to FIG. 7, a view port 701 is provided in the top seal plate 206 for passing the light beam 505 and the reflected signals 506 to the receiver 504. As the above-mentioned, the particle shielding plate 204 also needs to have corresponding holes to pass the signals.

Figure 8:
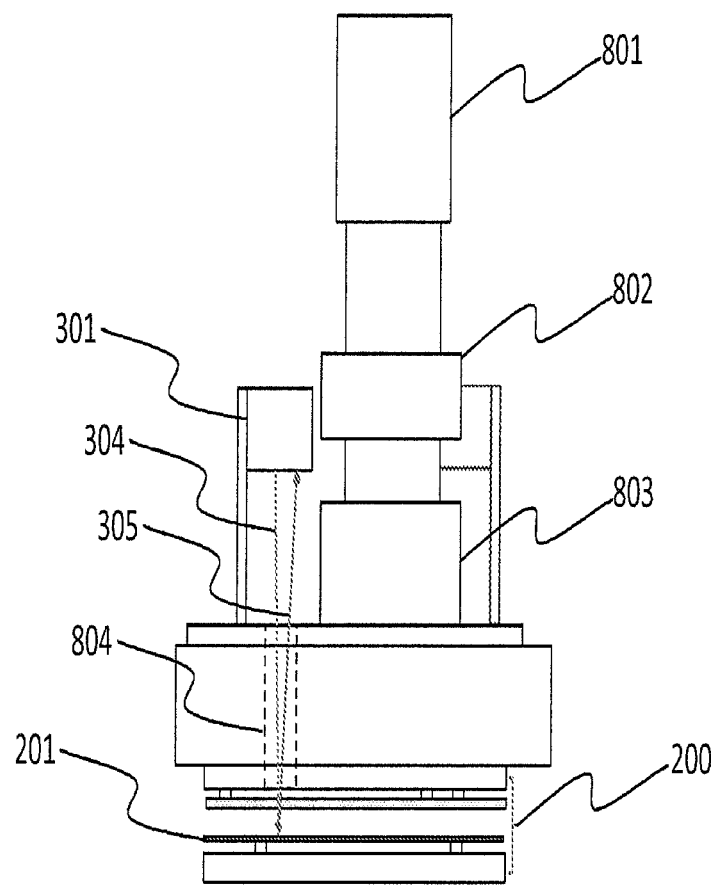
FIG. 8 is a schematic diagram illustrating a cross-section of a load lock system in accordance with one embodiment of the present invention.

In another embodiment, the above-mentioned embodiments of the load lock apparatus can be coupled to a load lock system 800 as shown in FIG. 8, which is used to transfer the wafer 201 between the load lock apparatus 200 (marked by a bracket) and the low vacuum environment for the inspection of the wafer 201. The turbo pump 801 is used to vacuum the load lock apparatus 200 until at least $10^{-5}$ torr and then, the wafer 201 is transferred from the low vacuum environment into the load lock apparatus 200. The damper 802 is used to alleviate the effect on the wafer 201 in the vibration from the pump 801. A turbo pump gate valve 803 is provided to switch on/off the turbo pump 801. The light signals 304 from the non-contact position detecting units 301 and the reflected signals 305 from the wafer 201 are passing through the channel 804 (enclosed by the dash line), including the view port 701 and holes 502, to identify the position of the wafer 201. Furthermore, the load lock system 800 with the load lock apparatus can be installed into an inspection tool, which is adopted from Chen et al. U.S. patent application Ser. No. 12/257,304 filed in Oct. 23, 2008 entitled "A Charged Particle Beam Apparatus". It is a modified Swing Objective Retarding Immersion Lens (SO-RIL).

Figure 9:
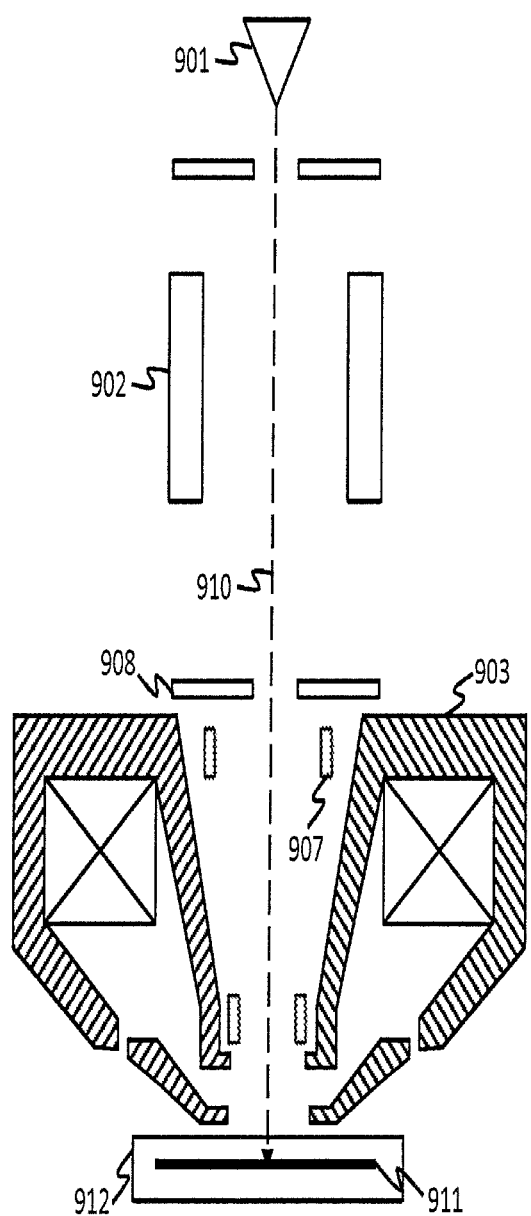
FIG. 9 shows a schematic diagram illustrating a scanning electron microscope in accordance with one embodiment of the present invention.

FIG. 9 depicts a cross sectional view of one embodiment of an inspection system 900. The system 900 includes a charged particle beam generator 901 for generating a primary electron beam 910, a condenser lens module 902 for condensing the primary electron beam 910, a probe forming objective lens module 903 for focusing the primary electron beam 910 into an electron beam probe, an electron beam deflection module 907 for scanning the electron beam probe across the surface of sample 911, a charged particle detector module 908 for detecting secondary electrons along with backscattered electrons from the sample 911 upon being bombarded by the electron beam probe and forming an image of the sample 911 accordingly, and a bottom seal load lock apparatus 912 for holding the sample 911 thereon during the imaging process. In the embodiment, the disclosed bottom seal load lock apparatus 912 is integrated in the inspection system 900 and is configured for supporting the wafer 911 thereon for imaging. Accordingly, the exemplary bottom seal load lock apparatus 912 of the present invention may apply to the scanning electron microscope to program.

One embodiment of a method for improving contamination particles from components in a charged particle beam inspection tool, which is practiced with the apparatus of FIG. 2. It comprises the following idea: reducing the component parts and/or removing the components, which possibly are the source of contamination particles. Accordingly, a maximum of three screws are used to fix a particle shielding plate 204 and a bottom seal plate 202, respectively, to the disclosed seal room 208 for holding the wafer 201. Furthermore, the position detecting units 301 for detecting the position of the wafer 201 are removing from the room 208, and now detect the wafer 201 from outside the room 208. It is contemplated that the method may be practiced on processing systems having different configurations and for other types of applications for reducing the contamination particles from components in the inspection tool as mentioned above.

In summary, the present invention provides an apparatus and method targeted for improving the residual contamination particles on the sample. Advantageously, both of the application of the simplified components consisting in the bottom load lock apparatus and removing the position detecting units from the apparatus allows the apparatus to easily reduce the degree of contamination particles.

Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. An apparatus comprising:
   a holder configured to hold a sample;
   a particle shielding plate disposed above the holder; and
   a position detecting unit including an emitter configured to project a light beam toward the holder,
   wherein the particle shielding plate includes an opening corresponding to the position detecting unit.

2. The apparatus of claim 1, further comprising a bottom plate disposed below the holder.

3. The apparatus of claim 2 further comprising a top seal plate disposed above the holder configured to form a room to seal the sample.

4. The apparatus of claim 3, wherein the particle shielding plate is inside the room and above the sample.

5. The apparatus of claim 1, wherein the position detecting unit is one of a plurality of position detecting units that are separated from the bottom seal plate and are configured to identify a position of the sample, the position including at least a vertical position of the sample.

6. The apparatus of claim 5, further comprising a view port located between the plurality of position detecting units and the sample to pass the light beam and a reflected signal from the sample.

7. The apparatus of claim 5, wherein the position detecting unit includes a laser sensor.

8. The apparatus of claim 2, further comprising at least one position detecting unit being a contact sensor positioned on the bottom plate.

9. The apparatus of claim 3, wherein the position detecting unit is configured to identify a position of the sample, the position detecting unit being positioned either external or internal the room, wherein the position includes at least a vertical position of the sample.

10. The apparatus of claim 9, wherein the position detecting unit includes a contact sensor positioned on the bottom plate.

11. The apparatus of claim 9, wherein the emitter is configured to project the light beam on the sample and the position detecting unit further includes a receiver for receiving the reflected signal from the sample to identify the position of the sample, the position detecting unit being separated from the bottom plate.

12. The apparatus of claim 11 further comprising a view port located between the position detecting unit and the sample to pass the light beam and a reflected signal from the sample.

13. The apparatus of claim 11, wherein the position detecting unit includes a laser sensor.

14. The apparatus of claim 1, wherein the apparatus is configured to be coupled to a load lock system to enable transfer of the sample between the apparatus and a low vacuum environment, wherein the load lock system is configured for use in an inspection tool.

15. The apparatus of claim 14, wherein the load lock apparatus is configured to be installed in a SORIL SEM.

16. A method for shielding components in a charged particle beam inspection tool from contamination particles, comprising:
    irradiating, by a position detecting unit, a sample provided on a holder through an opening in a particle shielding plate that is disposed above the holder.

17. The method of claim 16, wherein the position detecting unit includes an emitter configured to project a light beam toward the sample,
    wherein the particle shielding plate includes an opening corresponding to the emitter.

18. The method of claim 16, further comprising:
providing the sample in a room, the room formed at least partially by a bottom plate disposed below the holder and a top seal plate disposed above the holder.

19. The method of claim 16, further comprising:
receiving a reflected signal from the sample.

20. The method of claim 16, further comprising:
identifying a position of the sample, the position including at least a vertical position of the sample.

21. The method of claim 16, further comprising:
passing a light beam and a reflected signal from the sample through a view port located between the position detecting unit and the sample.

* * * * *